United States Patent
Song et al.

(10) Patent No.: US 11,158,698 B2
(45) Date of Patent: Oct. 26, 2021

(54) ORGANIC LIGHT-EMITTING DIODE DISPLAY

(71) Applicant: SAMSUNG DISPLAY CO., LTD., Yongin-si (KR)

(72) Inventors: Hee Rim Song, Seoul (KR); Mu Kyung Jeon, Ulsan (KR); Chong Chul Chai, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/829,085

(22) Filed: Mar. 25, 2020

(65) Prior Publication Data

US 2020/0227502 A1 Jul. 16, 2020

Related U.S. Application Data

(63) Continuation of application No. 14/928,991, filed on Oct. 30, 2015, now Pat. No. 10,615,240.

(30) Foreign Application Priority Data

Apr. 28, 2015 (KR) .......................... 10-2015-0059994

(51) Int. Cl.
*H01L 27/32* (2006.01)
*G09G 3/3233* (2016.01)
*H01L 51/52* (2006.01)

(52) U.S. Cl.
CPC ....... *H01L 27/3272* (2013.01); *G09G 3/3233* (2013.01); *H01L 27/3262* (2013.01);
(Continued)

(58) Field of Classification Search
CPC ............ H01L 27/3272; H01L 51/5209; H01L 51/5218; H01L 27/3262; H01L 27/3265;
(Continued)

(56) References Cited

U.S. PATENT DOCUMENTS 6,943,372 B2 9/2005 Lin
7,071,613 B2 7/2006 Kim et al.
(Continued)

FOREIGN PATENT DOCUMENTS

JP 4302914 2/2009
KR 10-0563131 3/2006
(Continued)

OTHER PUBLICATIONS

Office Action dated Feb. 19, 2021 of the corresponding Korean Patent Application No. 10-2015-0059994.

*Primary Examiner* — Patrick N Edouard
*Assistant Examiner* — Joseph P Fox
(74) *Attorney, Agent, or Firm* — F. Chau & Associates, LLC

(57) ABSTRACT

An organic light-emitting diode display is disclosed. In one aspect, the display includes a plurality of pixels formed in a plurality of intersection areas of a plurality of data lines and a plurality of scan lines. Each of the pixels includes a storage capacitor configured to store a data voltage, at least one target transistor having one end electrically connected to a current path of the storage capacitor, an organic light emitting layer, and a first electrode of an OLED formed over the organic light emitting layer. The first electrode includes a first electrode extension configured to block at least a portion of the target transistor from light.

14 Claims, 7 Drawing Sheets

(52) U.S. Cl.
CPC ...... *H01L 51/5209* (2013.01); *H01L 51/5218* (2013.01); *G09G 2300/0861* (2013.01); *G09G 2320/0238* (2013.01); *H01L 27/3211* (2013.01); *H01L 27/3265* (2013.01)

(58) Field of Classification Search
CPC .............. H01L 27/3211; G09G 3/3233; G09G 2320/0238; G09G 2300/0861
See application file for complete search history.

(56) References Cited

U.S. PATENT DOCUMENTS

| | | |
|---|---|---|
| 8,248,329 B2 | 8/2012 | Yamamoto et al. |
| 9,165,502 B2 | 10/2015 | Yamazaki et al. |
| 9,248,929 B2 | 2/2016 | Ehrmann et al. |
| 10,083,651 B2 | 9/2018 | Yamazaki et al. |
| 10,657,882 B2 | 5/2020 | Yamazaki et al. |
| 2008/0036371 A1 | 2/2008 | Kim |
| 2012/0050344 A1 | 3/2012 | Kim et al. |
| 2012/0069059 A1 | 3/2012 | Lee |
| 2012/0293496 A1 | 11/2012 | Park et al. |
| 2013/0120341 A1* | 5/2013 | Kasai .................. G09G 3/3291 345/211 |
| 2014/0027732 A1 | 1/2014 | Pyo et al. |
| 2014/0111490 A1 | 4/2014 | Lee et al. |
| 2016/0124557 A1 | 5/2016 | Choi |
| 2016/0321991 A1 | 11/2016 | Song et al. |
| 2020/0258449 A1 | 8/2020 | Yamazaki et al. |

FOREIGN PATENT DOCUMENTS

| | | |
|---|---|---|
| KR | 10-05700995 | 4/2006 |
| KR | 10-0620851 | 8/2006 |
| KR | 10-0700648 | 3/2007 |
| KR | 10-0709194 | 4/2007 |
| KR | 10-2014-0013513 | 2/2014 |
| KR | 10-2014-0026659 | 3/2014 |
| KR | 10-2014-0087825 | 7/2014 |

* cited by examiner

ORGANIC LIGHT-EMITTING DIODE DISPLAY

CROSS-REFERENCE TO RELATED APPLICATION

This application is a Continuation Application of U.S. application Ser. No. 14/928,991 filed on Oct. 30, 2015, which claims priority to and the benefit of Korean Patent Application No. 10-2015-0059994 filed in the Korean Intellectual Property Office on Apr. 28, 2015, the disclosures of which are incorporated by reference in their entireties herein.

BACKGROUND

Field

The described technology generally relates to an organic light-emitting diode display.

Description of the Related Technology

An organic light-emitting diode (OLED) includes two electrodes and an interposed organic light emitting layer. Electrons injected from one electrode and holes injected from the other electrode are coupled in the organic light emitting layer so as to form exciton and the exciton discharges energy to thereby emit light.

An OLED display includes a matrix of pixels including OLEDs, and each pixel includes a plurality of transistors for driving the OLED and a storage capacitor.

The storage capacitor included in each pixel is written with a data voltage during a data record period. The storage capacitor adjusts a current flowing in a driving transistor by holding the data voltage written during a next light emitting period to thereby allow the OLED to be emitted at a specific gray scale corresponding to the data voltage.

In general, since a light emitting period in which the storage capacitor holds the data voltage is relatively short upon a normal driving, a flicker phenomenon does not occur or is not viewed by a user.

However, since the number of times the data is written is reduced in a low frequency driving for reducing power consumption, the period in which the storage capacitor holds the data voltage is relatively increased.

Therefore, charges stored in the storage capacitor exit through a current leakage path over time, and a value of voltage held in the storage capacitor is dropped. In this case, since a change in luminance of the OLED occurs, the flicker phenomenon can occur.

In addition, if a transistor formed on the current leakage path is irradiated with external light or leakage light of a neighboring pixel, photo-leakage currents flow in the corresponding transistor.

Therefore, even though the corresponding transistor turned off, the charges stored in the storage capacitor exit along the flow of the current, and the flicker phenomenon is intensified.

Therefore, there is a need for a layout of an OLED display that can block external light or leakage light for the transistor formed on the current leakage path.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that can minimize or reduce a flicker phenomenon even upon a low frequency driving.

Another aspect is an OLED display including: a plurality of pixels formed in an intersection area of a plurality of data lines and a plurality of scan lines, wherein each of the plurality of pixels includes: a storage capacitor storing a data voltage; at least one target transistor having one end connected to a current path of the storage capacitor; an organic light emitting layer formed in a light emission area; and a first electrode of an organic light emitting element formed in an area overlapped with an area in which the organic light emitting layer is formed, and the first electrode includes a first electrode extension part formed so as to block at least a part of the target transistor from light.

Each of the plurality of pixels can further include: an initialization transistor having one end connected to one end of the storage capacitor and the other end connected to an initialization voltage line, and the target transistor can be the initialization transistor.

Each of the plurality of pixels can further include: a driving transistor adjusting an amount of current flowing in the organic light emitting element; and a compensation transistor having one end connected to a gate electrode of the driving transistor and one end of the storage capacitor, and the other end connected to one end of the driving transistor, and the target transistor can be the initialization transistor and the compensation transistor.

At least one of the initialization transistor and the compensation transistor can include a plurality of gate electrodes.

Each of the plurality of pixels can correspond to one pixel of a first color pixel, a second color pixel, and a third color pixel, the initialization transistor and the compensation transistor included in each of the first color pixel and the second color pixel can be blocked from light as much as a first area by the first electrode extension part, the initialization transistor and the compensation transistor included in the third color pixel can be blocked from light as much as a second area by the first electrode extension part, and the first area can be larger than the second area.

The initialization transistor and the compensation transistor included in each of the first color pixel and the second color pixel can be entirely blocked from light by the first electrode extension part, the initialization transistor included in the third color pixel can be entirely blocked from light by the first electrode extension part, and the compensation transistor included in the third color pixel can be partially blocked from light by the first electrode extension part.

The OLED display can be a mono color display device.

The initialization transistor and the compensation transistor included in each of the first color pixel and the second color pixel can be entirely blocked from light by the first electrode extension part, and the initialization transistor and the compensation transistor included in the third color pixel may not be blocked from light by the first electrode extension part.

The first color pixel can be a red pixel, the second color pixel can be a green pixel, and the third color pixel can be a blue pixel.

A plurality of organic light emitting layers included in the plurality of pixels which are adjacent to each other can be formed at a minimum interval allowed by a depositing mask.

The first electrode can be configured to have a minimum size including: an area overlapped with an area in which the organic light emitting layer is formed; the first electrode extension part; and a contact part applied with an electrical signal.

The OLED display can include a low power consumption mode driven at a lower frequency, and a time in which the storage capacitor holds a recoded voltage in the low power consumption mode can be longer than a time in which the storage capacitor holds the recorded voltage upon a normal driving.

Another aspect is an organic light-emitting diode (OLED) display, comprising: a plurality of pixels formed in a plurality of intersection areas of a plurality of data lines and a plurality of scan lines. Each of the pixels includes: a storage capacitor configured to store a data voltage; at least one target transistor having one end electrically connected to a current path of the storage capacitor; an organic light emitting layer; and a first electrode of an OLED formed over the organic light emitting layer. The first electrode includes a first electrode extension configured to block at least a portion of the target transistor from light.

In the above OLED display, each of the pixels further includes an initialization transistor having a first end electrically connected to a first end of the storage capacitor and a second end electrically connected to an initialization voltage line, wherein the target transistor includes the initialization transistor.

In the above OLED display, each of the pixels further includes: a driving transistor configured to adjust an amount of current flowing in the OLED; and a compensation transistor having a first end electrically connected to a gate electrode of the driving transistor and the first end of the storage capacitor, and a second end electrically connected to a first end of the driving transistor, wherein the target transistor includes the initialization transistor and the compensation transistor.

In the above OLED display, at least one of the initialization transistor and the compensation transistor includes a plurality of gate electrodes.

In the above OLED display, each of the pixels corresponds to one among a first color pixel, a second color pixel, and a third color pixel, wherein the first electrode extension is further configured to block the initialization and compensation transistors included in each of the first and second color pixels from the light by as much as a first area, wherein the first electrode extension is further configured to block the initialization and compensation transistors included in the third color pixel from the light by as much as a second area, and wherein the first area is larger than the second area.

In the above OLED display, the first electrode extension is further configured to completely block the initialization and compensation transistors included in each of the first and second color pixels from the light, wherein the first electrode extension is further configured to completely block the initialization transistor included in the third color pixel from the light, and wherein the first electrode extension is further configured to partially block the compensation transistor included in the third color pixel from the light.

The above OLED display comprises a mono color display device.

In the above OLED display, the first electrode extension is further configured to completely block the initialization and compensation transistors included in each of the first and second color pixels from the light, wherein the first electrode extension is further configured to not block the initialization and compensation transistors included in the third color pixel from the light.

In the above OLED display, the first, second and third colors respectively include red, green, and blue.

In the above OLED display, a first organic light emitting layer of one of the pixels is adjacent to a second organic emitting layer, wherein the first and second organic light emitting layers have a minimum interval therebetween formed by a depositing mask.

In the above OLED display, the first electrode is formed over the organic light emitting layer and includes: the first electrode extension; and a contact configured to be applied with an electrical signal.

In the above OLED display, the OLED display is configured to be driven in a low power consumption mode at a first frequency below a predetermined frequency, wherein a time in which the storage capacitor holds a recoded voltage in the low power consumption mode is greater than a time in which the storage capacitor holds the recorded voltage upon a normal driving.

Another aspect is an organic light-emitting diode (OLED) display, comprising: a storage capacitor having a first end electrically connected to a power source and configured to store a data voltage; a target transistor having a first end electrically connected to a second end of the storage capacitor; an OLED configured to receive the data voltage from the storage capacitor and including a first electrode, wherein the first electrode includes a first electrode extension formed over a portion of the target transistor and configured to block at least a portion of the target transistor from light.

In the above OLED display, the target transistor includes: a compensation transistor including a drain electrode electrically connected to the second end of the storage capacitor; and an initialization transistor including a drain electrode electrically connected to the second end of the storage capacitor.

The above OLED display further comprises a plurality of pixels each including the target transistor, wherein the first electrode extension overlaps the target transistor of each pixel in the depth dimension of the OLED display.

In the above OLED display, the compensation transistor includes first to third compensation transistors overlapping the first electrode extension in the depth dimension.

In the above OLED display, the initialization transistor includes first to third initialization transistors overlapping the first electrode in the depth dimension.

In the above OLED display, the OLED further includes an organic light emitting layer overlapping the first electrode and the first electrode extension in the depth dimension of the OLED display.

In the above OLED display, the first electrode has four sides, and wherein the first electrode extension is formed adjacent to three of the four sides of the first electrode.

In the above OLED display, the light includes external light or leakage light from a plurality of pixels other than a selected pixel including the OLED.

According to at least one of the disclosed embodiments, the OLED display can minimize the flicker phenomenon even while using the low frequency driving.

DETAILED DESCRIPTION OF CERTAIN INVENTIVE EMBODIMENTS

Figure 1:
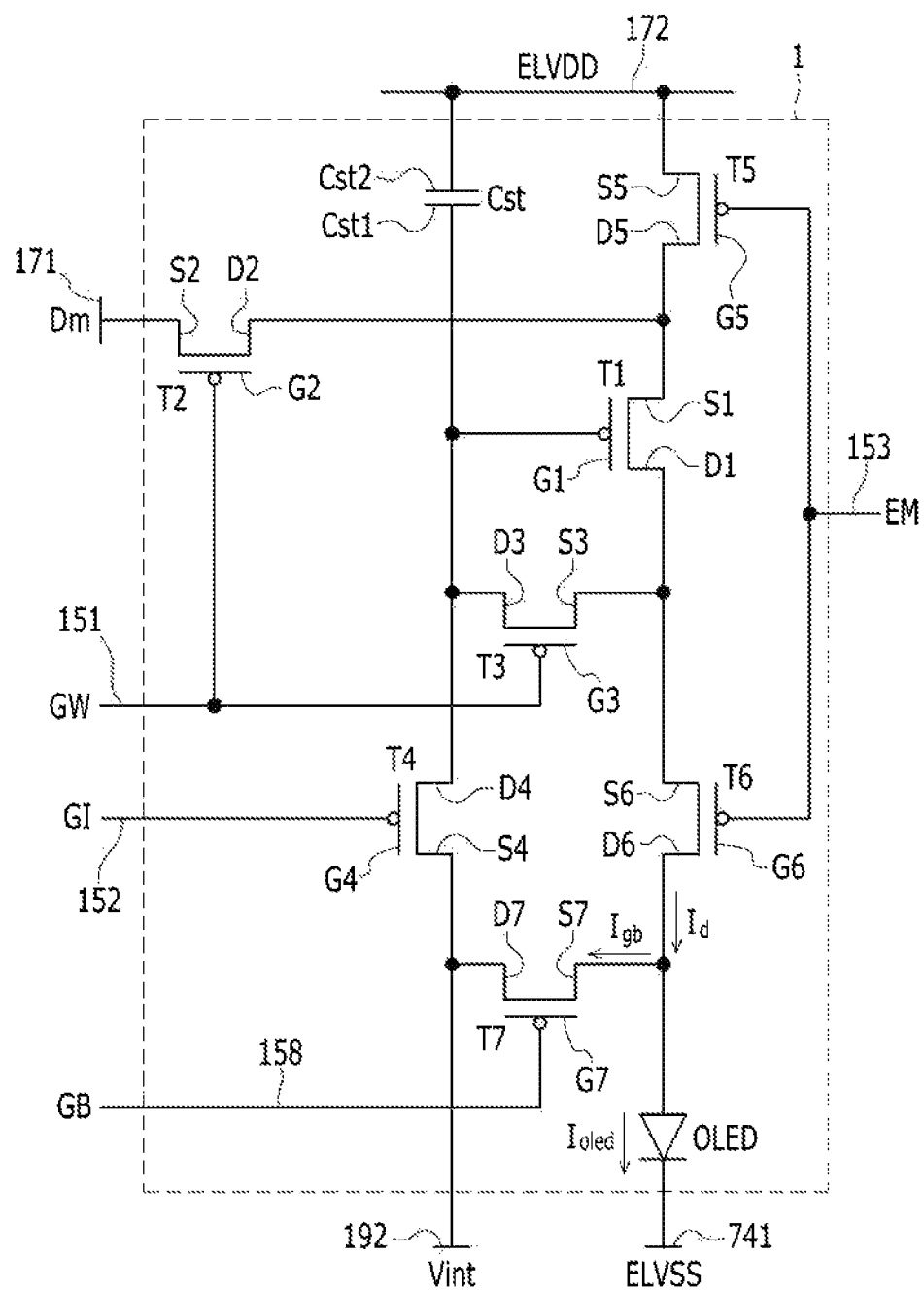
FIG. 1 is a circuit diagram of one pixel included in an OLED display according to an exemplary embodiment.

In the following detailed description, the described technology will be described more fully hereinafter with reference to the accompanying drawings, in which exemplary embodiments are shown As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present.

In addition, throughout the specification, unless explicitly described to the contrary, the word "comprise" and variations such as "comprises" or "comprising", will be understood to imply the inclusion of stated elements but not the exclusion of any other elements. In addition, throughout the specification, when an element is referred to as being "on" another element, it means that the element is positioned on or below of a target portion, and does not necessarily mean that the element is positioned at an upper side based on a gravity direction. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a circuit diagram of one pixel included in an OLED display according to an exemplary embodiment.

As shown in FIG. 1, one pixel 1 of the OLED display according to the exemplary embodiment includes a plurality of signal lines 151, 152, 153, 158, 171, 172, and 192, a plurality of transistors T1, T2, T3, T4, T5, T6, and T7 connected to the plurality of signal lines, a storage capacitor Cst, and an OLED.

The transistors T1, T2, T3, T4, T5, T6, and T7 includes a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 includes a scan line 151 that transfers a scan signal GW, a scan line 152 that transfers a scan signal GI to the initialization transistor T4, a light emission control line 153 that transfers a light emission control signal EM to the operation control transistor T5 and the light emission control transistor T6, a bypass control line 158 that transfers a bypass signal GB to the bypass transistor T7, a data line 171 that intersects with the scan line 151 and transfers a data signal Dm, a driving voltage line 172 that transfers a driving voltage ELVDD and is formed to be substantially in parallel to the data line 171, and an initialization voltage line 192 that transfers an initialization voltage Vint initializing the driving transistor T1.

A gate electrode G1 of the driving transistor T1 is connected to one end Cstl of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm in response to a switching operation of the switching transistor T2 and supplies a driving current $I_d$ to the OLED.

A gate electrode G2 of the switching transistor T2 is connected to the scan line 151, a source electrode S2 of the switching transistor T2 is connected to the data line 171, and a drain electrode D2 of the switching transistor T2 is connected to the source electrode S1 of the driving transistor T1 and is connected to the driving voltage line 172 via the operation control transistor T5. The switching transistor T2 is turned on in response to the scan signal GW received through the scan line 151 to perform a switching operation that transfers the data signal Dm transferred to the data line 171 to the source electrode S1 of the driving transistor T1.

A gate electrode G3 of the compensation transistor T3 is connected to the scan line 151, a source electrode S3 of the compensation transistor T3 is connected to the drain electrode D1 of the driving transistor T1 and is connected to the anode of the OLED via the light emission control transistor T6, and a drain electrode D3 of the compensation transistor T3 is connected together to a drain electrode D4 of the initialization transistor T4, one end Cstl of the storage capacitor Cst, and the gate electrode G1 of the driving transistor T1. The compensation transistor T3 is turned on in response to the scan signal GW received through the scan line 151 to connect the gate electrode G1 and the drain electrode D1 of the driving transistor T1 to each other, which causes the driving transistor T1 to be diode-connected.

A gate electrode G4 of the initialization transistor T4 is connected to the scan line 152, a source electrode S4 of the initialization transistor T4 is connected to the initialization voltage line 192, and a drain electrode D4 of the initialization transistor T4 is connected together to one end Cstl of the storage capacitor Cst and the gate electrode G1 of the driving transistor T1 via the drain electrode D3 of the compensation transistor T3. The initialization transistor T4 is turned on in response to the scan signal GI received through the scan line 152 to transfer the initialization voltage Vint to the gate electrode G1 of the driving transistor T1, thereby performing an initialization operation initializing the gate voltage of the gate electrode G1 of the driving transistor T1.

A gate electrode T5 of the operation control transistor T5 is connected to the light emission control line 153, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode T6 of the light emission control transistor T6 is connected to the light emission control line 153, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the OLED. The operation control transistor T5 and the light emission control transistor T6 are substantially simultaneously (or concurrently) turned on in response to the light emission control signal EM transferred through the light emission control line 153, and as a result, the driving voltage ELVDD is compensated by the driving transistor T1 diode-connected and is transferred to the OLED.

A gate electrode G7 of the bypass transistor T7 is connected to the bypass control line 158, a source electrode S7 of the bypass transistor T7 is connected together to the drain electrode D6 of the light emission control transistor T6 and the anode of the OLED, and a drain electrode D7 of the bypass transistor T7 is connected together to the initialization voltage line 192 and the source electrode S4 of the initialization transistor T4. Depending on the exemplary embodiments, the bypass control line 158 is connected to the scan line 152, such that the bypass signal GB can be substantially equal to the scan signal GI.

The other end Cst2 of the storage capacitor Cst is connected to the driving voltage line 172, and a cathode of the OLED is connected to a common voltage line 741 that transfers a common voltage ELVSS.

Meanwhile, the exemplary embodiment shows seven transistors and one capacitor structure including the bypass transistor T7, but the described technology is not limited thereto. The number of transistors and the number of capacitors can be variously changed.

Hereinafter, a detailed operation process of one pixel of the OLED display according to the exemplary embodiment will be described in detail with reference to FIG. 2.

Figure 2:
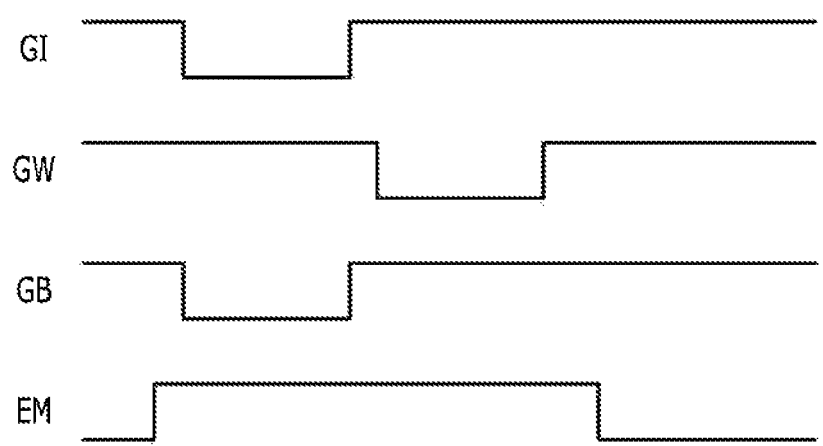
FIG. 2 is a timing diagram of a signal applied to the pixel according to an exemplary embodiment.

FIG. 2 is a timing diagram of a signal applied to the pixel according to an exemplary embodiment.

As shown in FIG. 2, first, the scan signal GI of a low level is supplied through the scan line 152 during an initialization period. Then, the initialization transistor T4 is turned on in response to the scan signal GI of the low level, the initialization voltage Vint is connected to the gate electrode G1 of the driving transistor T1 through the initialization transistor T4 from the initialization voltage line 192, and the driving transistor T1 is initialized by the initialization voltage Vint.

Thereafter, a scan signal GW of a low level is supplied through the scan line 151 during a data record period. Then, the switching transistor T2 and the compensation transistor T3 are turned on in response to the scan signal GW of the low level. In this case, the driving transistor T1 is diode-connected by the turned-on compensation transistor T3 and is forward-biased Then, a compensation voltage Dm+Vth including a threshold voltage Vth of the driving transistor T1 (Vth is a negative value) reduced from the data signal Dm supplied from the data line 171 is applied to the gate electrode G1 of the driving transistor T1. Here, the data signal Dm is a data voltage. The driving voltage ELVDD and the compensation voltage Dm+Vth are applied to both ends of the storage capacitor Cst, and charges corresponding to a voltage difference of both ends are stored in the storage capacitor Cst.

Thereafter, the light emission control signal EM supplied from the light emission control signal 153 during a light emission period is changed from a high level to a low level. Then, the operation control transistor T5 and the light emission control transistor T6 are turned on by the light emission control signal EM of a low level during the light emission period.

Then, a driving current $I_d$ according to a voltage difference between the gate voltage of the gate electrode G1 of the driving transistor T1 and the driving voltage ELVDD is generated, and the driving current $I_d$ is supplied to the OLED through the light emission control transistor T6.

By the storage capacitor Cst during the light emission period, a voltage of the gate electrode G1 of the driving transistor T1 becomes ELVDD+(Dm+Vth), and a voltage of the source electrode S1 thereof becomes ELVDD. Therefore, a gate-source voltage Vgs of the driving transistor T1 becomes Dm+Vth. Since the driving current of the transistor is substantially proportional to a square of a value obtained by subtracting the threshold voltage Vth from the gate-source voltage Vgs, it is substantially proportional to a square value of the data signal Dm. Therefore, the driving current $I_d$ is determined regardless of the threshold voltage Vth of the driving transistor T1.

The bypass transistor T7 receives the bypass signal GB from the bypass control line 158. The bypass signal GB is a predetermined level of voltage which can always turn off the bypass transistor T7. And the bypass transistor T7 transfers a transistor-off level of voltage to the gate electrode G7, such that the bypass transistor T7 is always turned-off and some of the driving current $I_d$ exits through the bypass transistor T7 as a bypass current $I_{gb}$ in a state in which the bypass transistor T7 is turned-off.

Also in a case in which a minimum current of the driving transistor T1 displaying a black image flows as the driving current, if the OLED emits light, the black image is not properly displayed. Therefore, the bypass transistor T7 of the OLED display according to the exemplary embodiment can diffuse some of the minimum current of the driving transistor T1 to other current paths other than a current path of the OLED side, as the bypass current $I_{gb}$. Here, the minimum current of the driving transistor T1 means a current in the condition in which the gate-source voltage Vgs of the driving transistor T1 is less than the threshold voltage Vth to thereby turn off the driving transistor T1. As described above, a minimum driving current (e.g., a current of about 10 pA or less) in the condition in which the driving transistor T1 is turned-off is transferred to the OLED and is represented by an image of black luminance. If the minimum driving current displaying the black image flows, an influence of a bypass transfer of the bypass current $I_{gb}$ is great, while if a large driving current displaying an image such as a normal image or a white image flows, the influence of the bypass current $I_{gb}$ can be almost insignificant. Therefore, in the case in which the driving current displaying the black image flows, a light emission current $I_{oled}$ of the OLED, which is substantially equal to the driving current $I_d$ minus a current amount of the bypass current $I_{gb}$ exiting through the bypass transistor T7, has a minimum current amount of a level capable of surely representing the black image. Therefore, a contrast ratio can be improved by implementing a substantially exact black luminance image using the bypass transistor T7. The bypass signal GB is substantially equal to the scan signal GI in FIG. 2, but is not limited thereto. The scan signal can be a previous stage scan signal and the scan signal GW can be a current stage scan signal.

Figure 3:
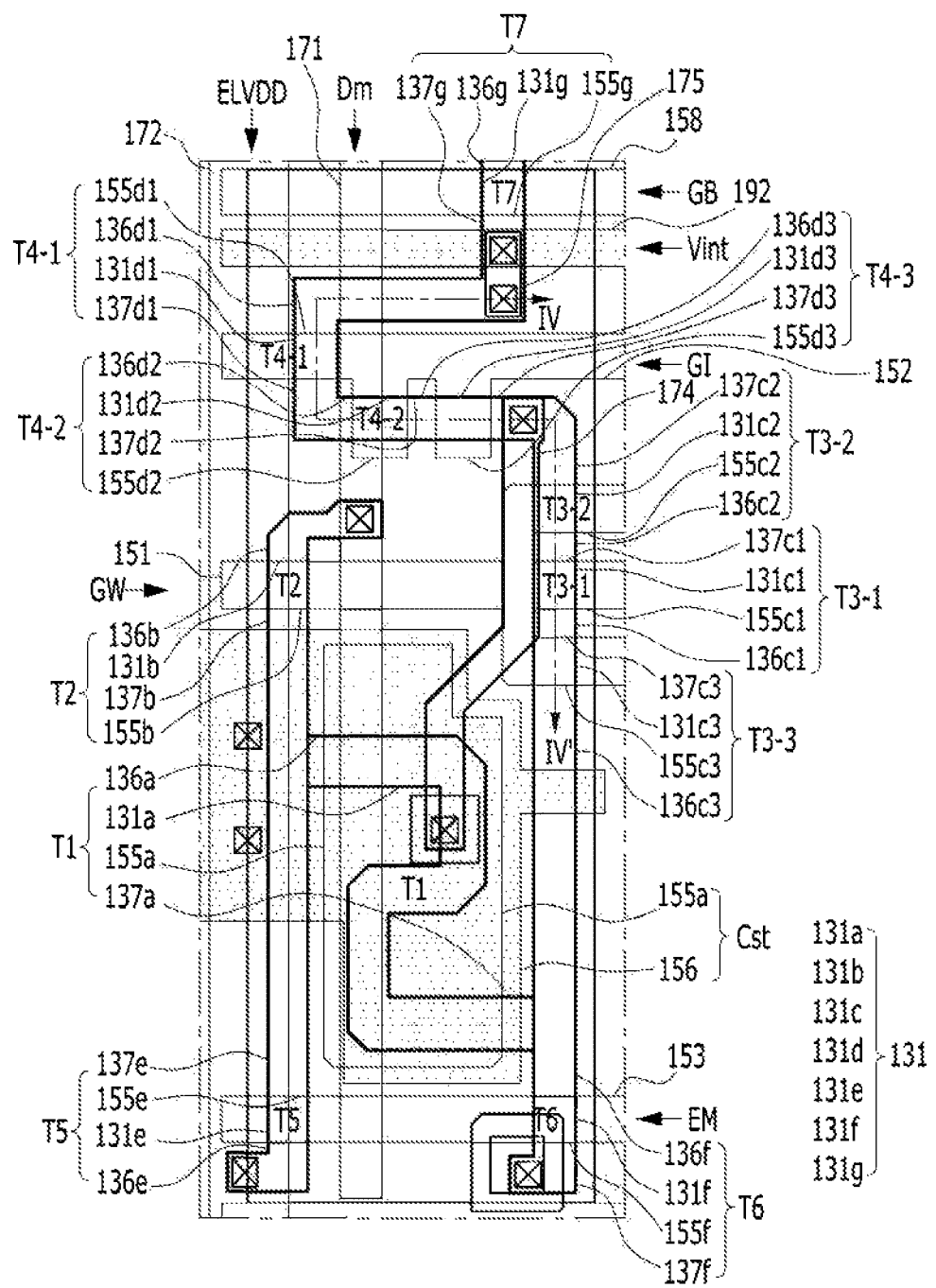
FIG. 3 is a plan view of the pixel according to an exemplary embodiment.

FIG. 3 is a plan view of the pixel according to an exemplary embodiment.

First, as shown in FIGS. 1 and 3, the OLED display according to the exemplary embodiment applies the scan signal GW, the scan signal GI, the light emission control signal EM, and the bypass signal GB, respectively, and includes the scan line 151, the scan line 152, the light emission control line 153, and the bypass control line 158 which are formed along a row direction. In addition, the OLED display according to the exemplary embodiment includes the data line 171 and the driving voltage line 172 which intersect with the scan line 151, the scan line 152, the light emission control line 153, and the bypass control line 158, and apply the data signal Dm and the driving voltage ELVDD, respectively, to the pixel 1. The initialization voltage Vint is transferred to the compensation transistor T3 via the initialization transistor T4 from the initialization voltage line 192.

In addition, in the pixel 1, the driving transistor T1, the switching transistor T2, the compensation transistor T3, the initialization transistor T4, the operation control transistor T5, the light emission control transistor T6, the bypass transistor T7, the storage capacitor Cst, and the OLED are formed. The OLED includes an anode, an organic light emitting layer, and a cathode. In this case, in an OLED display according to a first exemplary embodiment, the compensation transistor T3 and the initialization transistor T4 are configured as a transistor having a multi gate structure in order to effectively block a leakage current.

A channel of each of the driving transistor T1, the switching transistor T2, the compensation transistor T3, the initialization transistor T4, the operation control transistor T5, the light emission control transistor T6, and the bypass transistor T7 can be formed in one connected semiconductor, and the semiconductor can be formed so as to be bent in various shapes. The above-mentioned semiconductor can be formed of a polycrystalline semiconductor material or an oxide semiconductor material. The oxide semiconductor material can include an oxide including titanium (Ti), hafnium (Hf), zirconium (Zr), aluminum (Al), tantalum (Ta), germanium (Ge), zinc (Zn), gallium (Ga), tin (Sn) or indium (In), and any one of zinc oxide (ZnO), indium-gallium-zinc oxide (InGaZnO$_4$), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide(In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide(In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O), which are complex oxides thereof. In a case in which the semiconductor is formed of an oxide semiconductor material, a separate passivation layer can be added in order to protect the oxide semiconductor material which is vulnerable to an external environment such as high temperature, or the like.

The semiconductor includes a channel which is channel-doped with N-type impurities or P-type impurities, and a source doping part and a drain doping part which are formed on both sides of the channel and have a doping amount larger than the doped impurities which are doped on the channel. According to the described technology, the source doping part and the drain doping part correspond to the source electrode and the drain electrode, respectively. The source electrode and the drain electrode formed in the semiconductor can be formed by doping only the corresponding region. In addition, a region between the source electrodes and the drain electrodes of different transistors in the semiconductor is also doped, thereby making it possible to electrically connect the source electrode and the drain electrode to each other.

As shown in FIG. 3, a channel 131 includes a driving channel 131*a* formed in the driving transistor T1, a switching channel 131*b* formed in the switching transistor T2, a compensation channel 131*c* formed in the compensation transistor T3, an initialization channel 131*d* formed in the initialization transistor T4, an operation control channel 131*e* formed in the operation control transistor T5, a light emission control channel 131*f* formed in the light emission control transistor T6, and a bypass channel 131*g* formed in the bypass transistor T7.

The driving transistor T1 includes the driving channel 131*a*, a driving gate electrode 155*a*, a driving source electrode 136*a*, and a driving drain electrode 137*a*. The driving channel 131*a* is curved and can have a meandering shape or a zigzag shape. As such, by forming the driving channel 131*a* having the curved shape, the driving channel 131*a* can be formed to be long in a narrow space. Therefore, a driving range of the gate voltage Vg applied to the driving gate electrode 155*a* is widened by the driving channel 131 formed to be long. Since the driving range of the gate voltage Vg is wide, a gray scale of light emitted from the OLED can be more precisely controlled by changing magnitude of the gate voltage Vg, and as a result, resolution of the OLED display can be increased and display quality thereof can be improved. By variously deforming the shape of the above-mentioned driving channel 131*a*, various exemplary embodiments such as 'inverse S', 'S', 'W', etc. can be implemented.

The driving gate electrode 155*a* overlaps the driving channel 131*a*, and the driving source electrode 136*a* and the driving drain electrode 137*a* are each formed so as to be adjacent to both sides of the driving channel 131*a*. The driving gate electrode 155*a* is connected to a first data connection member 174 through a contact hole (not shown).

Meanwhile, the switching transistor T2 includes a switching channel 131*b*, a switching gate electrode 155*b*, a switching source electrode 136*b*, and a switching drain electrode 137*b*. The switching gate electrode 155*b*, which is a part extended downwardly from the scan line 151, overlapped the switching channel 131*b*. The switching source electrode 136*b* and the switching drain electrode 137*b* are each formed so as to be adjacent to both sides of the switching channel 131*b*. The switching source electrode 136*b* is connected to the data line 171 through the contact hole.

Three compensation transistors T3 are formed to prevent a leakage current, and include a first compensation transistor T3-1, a second compensation transistor T3-2, and a third compensation transistor T3-3 which are adjacent to each other. The first compensation transistor T3-1 is positioned around the scan line 151, and the second compensation transistor T3-2 is positioned around an upper protrusion part of the scan line 151. In addition, the third compensation transistor T3-3 is positioned around a lower protrusion part of the scan line 151. The first compensation transistor T3-1 includes a first compensation channel 131*c*1, a first compensation gate electrode 155*c*1, a first compensation source electrode 136*c*1, and a first compensation drain electrode 137*c*1 The second compensation transistor T3-2 includes a second compensation channel 131*c*2, a second compensation gate electrode 155c2, a second compensation source electrode 136c2, and a second compensation drain electrode 137c2. In addition, the third compensation transistor T3-3 includes a third compensation channel 131c3, a third compensation gate electrode 155c3, a third compensation source electrode 136c3, and a third compensation drain electrode 137c3.

The first compensation gate electrode 155c1, which is a part of the scan line 151, overlaps the first compensation channel 131c1. The first compensation source electrode 136c1 and the first compensation drain electrode 137c1 are each formed so as to be adjacent to both sides of the first compensation channel 131c1. The first compensation source electrode 136c1 is connected to a light emission control source electrode 136f, and the first compensation drain electrode 137c1 is connected to the second compensation source electrode 136c2.

The second compensation gate electrode 155c2, which is a protrusion part upwardly protruding from the scan line 151, overlaps the second compensation channel 131c2. The second compensation source electrode 136c2 and the second compensation drain electrode 137c2 are each formed so as to be adjacent to both sides of the second compensation channel 131c2. The second compensation drain electrode 137c2 is connected to the first data connection member 174 through the contact hole.

The third compensation gate electrode 155c3 overlaps the third compensation channel 131c3, and the third compensation source electrode 136c3 and the third compensation drain electrode 137c3 are each formed so as to be adjacent to both sides of the third compensation channel 131c3. The third compensation drain electrode 137c3 is connected to the first compensation source electrode 136c1.

Three initialization transistors T4 are formed to prevent the leakage current, and include a first initialization transistor T4-1, a second initialization transistor T4-2, and a third initialization transistor T4-3 which are adjacent to each other. The first initialization transistor T4-1 is positioned around the scan line 152, and the second initialization transistor T4-2 is positioned around a left protrusion part of the scan line 152. The third initialization transistor T4-3 is positioned around a right protrusion part of the scan line 152. The first initialization transistor T4-1 includes a first initialization channel 131d1, a first initialization gate electrode 155d1, a first initialization source electrode 136d1, and a first initialization drain electrode 137d1, and the second initialization transistor T4-2 includes a second initialization channel 131d2, a second initialization gate electrode 155d2, a second initialization source electrode 136d2, and a second initialization drain electrode 137d2. In addition, the third initialization transistor T4-3 includes a third initialization channel 131d3, a third initialization gate electrode 155d3, a third initialization source electrode 136d3, and a third initialization drain electrode 137d3.

The first initialization gate electrode 155d1, which is a part of the scan line 152, overlaps the first initialization channel 131d1 and is each formed so as to be adjacent to both sides of the first initialization channel 131d1. The first initialization source electrode 136d1 is connected to a second data connection member 175 through the contact hole, and the first initialization drain electrode 137d1 is connected to the second initialization source electrode 136d2.

The second initialization gate electrode 155d2, which is a protrusion part downwardly protruding from the scan line 152, overlaps the second initialization channel 131d2. The second initialization source electrode 136d2 and the second initialization drain electrode 137d2 are each formed so as to be adjacent to both sides of the second initialization channel 131d2.

Similarly, the third initialization gate electrode 155d3, which is a protrusion part downwardly protruding from the scan line 152, is overlapped with the third initialization channel 131d3, and the third initialization source electrode 136d3 and the third initialization drain electrode 137d3 are each formed so as to be adjacent to both sides of the third initialization channel 131d3. The third initialization drain electrode 137d3 is connected to the first data connection member 174 through the contact hole.

As such, the three compensation transistors, that is, the first compensation transistor T3-1, the second compensation transistor T3-2, and the third compensation transistor T3-3 are formed. And three initialization transistors T4, that is, the first initialization transistor T4-1, the second initialization transistor T4-2, and the third initialization transistor T4-3 are formed, thereby making it possible to effectively (or substantially) prevent the charges from exiting from the storage capacitor Cst.

The operation control transistor T5 includes an operation control channel 131e, an operation control gate electrode 155e, an operation control source electrode 136e, and an operation control drain electrode 137e. The operation control gate electrode 155e, which is a part of the light emission control line 153, overlaps the operation control channel 131e. And the operation control source electrode 136e and the operation control drain electrode 137e are each formed so as to be adjacent to both sides of the operation control channel 131e. The operation control source electrode 136e is connected to a part of the driving voltage line 172 through the contact hole.

The light emission control transistor T6 includes a light emission control channel 131f, a light emission control gate electrode 155f, a light emission control source electrode 136f, and a light emission control drain electrode 137f. The light emission control gate electrode 155f, which is a part of the light emission control line 153, overlaps the light emission control channel 131f. The light emission control source electrode 136f and the light emission control drain electrode 137f are each formed so as to be adjacent to both sides of the light emission control channel 131f.

The bypass transistor T7 includes a bypass channel 131g, a bypass gate electrode 155g, a bypass source electrode 136g, and a bypass drain electrode 137g. The bypass gate electrode 155g, which is a part of the bypass control line 158, overlaps the bypass channel 131g, and the bypass source electrode 136g and the bypass drain electrode 137g are each formed so as to be adjacent to both sides of the bypass channel 131g.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 156 which are formed while having a second insulating layer 142 therebetween. The first storage electrode 155a corresponds to the driving gate electrode 155a, and the second storage electrode 156, which is a part extended from the storage line, occupies an area wider than the driving age electrode 155a and fully covers the driving gate electrode 155a. Here, the second insulating layer 142 is a dielectric, and storage capacitance is determined by charges stored in the storage capacitor Cst and a voltage between both electrodes 155a and 156. As such, by using the driving gate electrode 155a as the first storage electrode 155a, a space in which the storage capacitor can be formed can be secured in a space which is narrowed by the driving channel 131a occupying a large area in the pixel.

The second storage electrode 156 is connected to the driving voltage line 172 through a contact and is applied with the driving voltage ELVDD.

Figure 4:
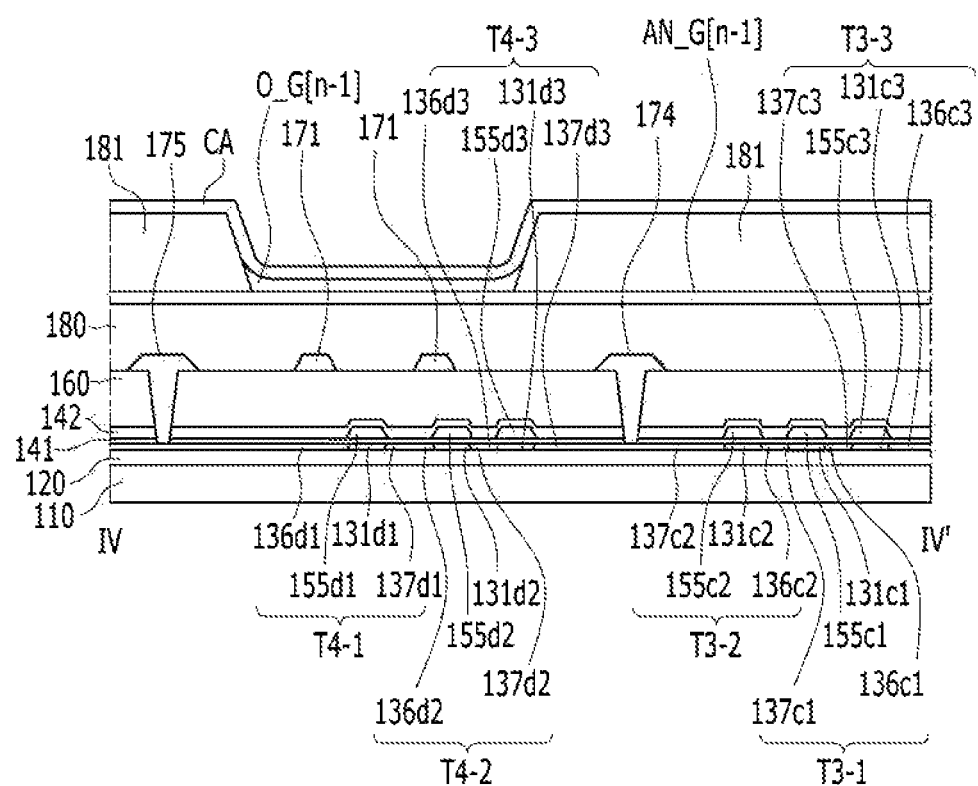
FIG. 4 is a cross-sectional view taken along a line IV-IV' of FIG. 3.

FIG. 4 is a cross-sectional view taken along a line IV-IV' of FIG. 3.

Referring to FIG. 4, a buffer layer 120 is formed on a substrate 110. The substrate 110 can be formed of an insulating substrate formed of glass, quartz, ceramic, plastic, or the like. The buffer layer 120 can serve to improve property of a polycrystalline semiconductor and reduce stress applied to the substrate 110 by blocking impurities from the substrate 110 upon a crystallization process for forming the polycrystalline semiconductor.

The semiconductor including the driving channel 131a, the switching channel 131b, the compensation channel 131c, the initialization channel 131d, the operation control channel 131e, the light emission control channel 131f, and the bypass channel 131g is formed on the buffer layer 120. In the semiconductor, the driving source electrode 136a and the driving drain electrode 137a are formed on both sides of the driving channel 131a, and the switching source electrode 136b and the switching drain electrode 137b are formed on both sides of the switching channel 131b. In addition, the first compensation source electrode 136c1 and the first compensation drain electrode 137c1 are formed on both sides of the first compensation channel 131c1, the second compensation source electrode 136c2 and the second compensation drain electrode 137c2 are formed on both sides of the second compensation channel 131c2. The first initialization source electrode 136d1 and the first initialization drain electrode 137d1 are formed on both sides of the first initialization channel 131d1. The second initialization source electrode 136d2 and the second initialization drain electrode 137d2 are formed on both sides of the second initialization channel 131d2. The operation control source electrode 136e and the operation control drain electrode 137e are formed on both sides of the operation control channel 131e, and the light emission control source electrode 136f and the light emission control drain electrode 137f are formed on the both sides of the light emission control channel 131f. In addition, the bypass source electrode 136g and the bypass drain electrode 137g are formed on both sides of the bypass channel 131g.

In addition, the third compensation source electrode 136c3 and the third compensation drain electrode 137c3 are formed on both sides of the third compensation channel 131c3. The third initialization source electrode 136d3 and the third initialization drain electrode 137d3 are formed on both sides of the third initialization channel 131d3.

A first gate insulating layer 141 covering the semiconductor is formed on the semiconductor. A first gate wiring including the previous stage scan line 152 including the first initialization gate electrode 155d1, the second initialization gate electrode 155d2, and the third initialization gate electrode 155d3 is formed on the first insulating layer 141. The scan line 151 including the first compensation gate electrode 155c1, the second compensation gate electrode 155c2, and the third compensation gate electrode 155c3 is also formed on the first insulating layer 141.

The second gate insulating layer 142 covering the first gate wiring and the first gate insulating layer 141 is formed on the first gate wiring and the first gate insulating layer 141. The first gate insluting layer 141 and the second gate insulating layer 142 can be formed of silicon nitride (SiNx) or silicon oxide (SiO$_2$).

The storage line is formed in parallel to the scan line 151 on the second gate insulating layer 142. A second gate wiring (not shown) including the second storage electrode 156, which is a part extended from the storage line, can be formed on the second gate insulating layer 142.

An interlayer insulating layer 160 is formed on the second gate insulating layer 142 or the second gate wiring (not shown). The interlayer insulating layer 160 can be formed of silicon nitride (SiNx) or silicon oxide (SiO$_2$).

A contact hole is formed in the interlayer insulating layer 160. On the interlayer insulating layer 160, data wirings 171, 172, 174, and 175 including the data line 171, the driving voltage line 172, the first data connection member 174, and the second data connection member 175 are formed.

A first organic insulating layer 180 covering the data wirings 171, 172, 174, and 175, and the interlayer insulating layer 160 is formed on the data wirings 171, 172, 174, and 175, and the interlayer insulating layer 160. The first organic insulating layer 180 includes a via hole for connecting an anode of each pixel to the drain electrode 137f of the light emission control transistor T6. An anode AN_G[n−1] of the OLED is formed on the first organic insulating layer 180. The anode can be represented as a first electrode of the OLED.

As resolution of the OLED display is increased, it is difficult to form the anode and the organic light emitting layer so as to be exactly overlapping each pixel circuit forming area. Therefore, the anode AN_G[n−1] and the organic light emitting layer O_G[n−1] shown in FIG. 4 are illustratively shown based on a pixel G[n] of FIG. 6. The pixel G[n] of FIG. 6 is a unit pixel area including transistors T1_G[n], T2_G[n], T3_G[n], T4_G[n], T5_G[n], T6_G[n], and T7_G[n] with reference to FIG. 5. A shape and arrangement of the anode and the organic light emitting layer can be changed for each pixel.

The anode AN_G[n−1] can be formed of a transparent conductive material such as indium tin oxide (ITO), indium zinc oxide (IZO), zinc oxide (ZnO), indium oxide (In$_2$O$_3$), or the like, or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), or the like. In a case in which the anode AN_G[n−1] is formed of the reflective metal of ITO/Ag/ITO, it exhibits reflectivity of about 90%. Therefore, the anode AN_G[n−1] can serve to block external light and leakage light of other pixels.

The second organic insulating layer 181 is formed on the first organic insulating layer 180 or the anode AN_G[n−1]. The second organic insulating layer 181 is also called as a pixel defined layer that partitions a light emission area of an organic light emitting element.

The second organic insulating layer 181 can be formed of a resin such as polyacrylates or polyimides.

The organic light emitting layer O_G[n−1] is formed on the anode AN_G[n−1] in the light emission area partitioned by the second organic insulating layer 181.

The organic light emitting layer O_G[n−1] is formed in a single layer or a multi-layer including one or more of a light emitting layer, a hole-injection layer (HIL), a hole-transporting layer (HTL), an electron-transporting layer (ETL), and an electron-injection layer (EIL).

In a case in which the organic light emitting layer O_G[n−1] includes all of the above-mentioned layers, the hole-injection layer is positioned on the anode electrode 180, on which the hole-transporting layer, the light emitting layer, the electron-transporting layer, and the electron-injection layer can be sequentially staked.

The organic light emitting layer O_G[n−1] can include a red organic light emitting layer that emits red, a green organic light emitting layer that emits green, and a blue organic light emitting layer that emits blue. The red, green, and blue organic light emitting layers are formed in a red pixel, a green pixel, and a blue pixel, respectively, to implement a color image.

In addition, the organic light emitting layer O_G[n−1] stacks the red organic light emitting layer, the green organic light emitting layer, and the blue organic light emitting layer all together in the red pixel, the green pixel, and the blue pixel, and forms a red filter, a green filter, and a blue filter for each pixel, thereby making it possible to implement the color image. As another example, a white organic light emitting layer that emits white is formed in all of the red pixel, the green pixel, and the blue pixel. And the red filter, the green filter, and the blue filter are each formed for each pixel, thereby making it possible to implement the color image. In a case in which the color image is implemented using the white organic light emitting layer and the color filter, a deposition mask for depositing the red organic light emitting layer, the green organic light emitting layer, and the blue organic light emitting layer on the respective individual pixels, that is, the red pixel, the green pixel, and the blue pixel needs not to be used.

The white organic light emitting layer described in another example can be formed in a single organic light emitting layer, and also include a configuration in which a plurality of organic light emitting layers are stacked to enable white light emission. By way of example, the white organic light emitting layer can also include a configuration in which at least one yellow organic light emitting layer and at least one blue organic light emitting layer are combined to enable white light emission, a configuration in which at least one cyan organic light emitting layer and at least one red organic light emitting layer are combined to enable white light emission, a configuration in which at least one magenta organic light emitting layer and at least one green organic light emitting layer are combined to enable white light emission, and the like.

A cathode CA is formed on the second organic insulating layer 181 and the organic light emitting layer O_G[n−1]. The cathode CA can be formed of a transparent conductive material such as ITO, IZO, ZnO, $In_2O_3$, or the like, or a reflective metal such as lithium, calcium, lithium fluoride/calcium, lithium fluoride/aluminum, aluminum, silver, magnesium, gold, or the like.

According to the present exemplary embodiment, the cathode CA can be formed in a plate shape covering an overall pixel. The cathode CA is applied with a common voltage ELVSS. The cathode can be represented as a second electrode of the OLED.

Figure 5:
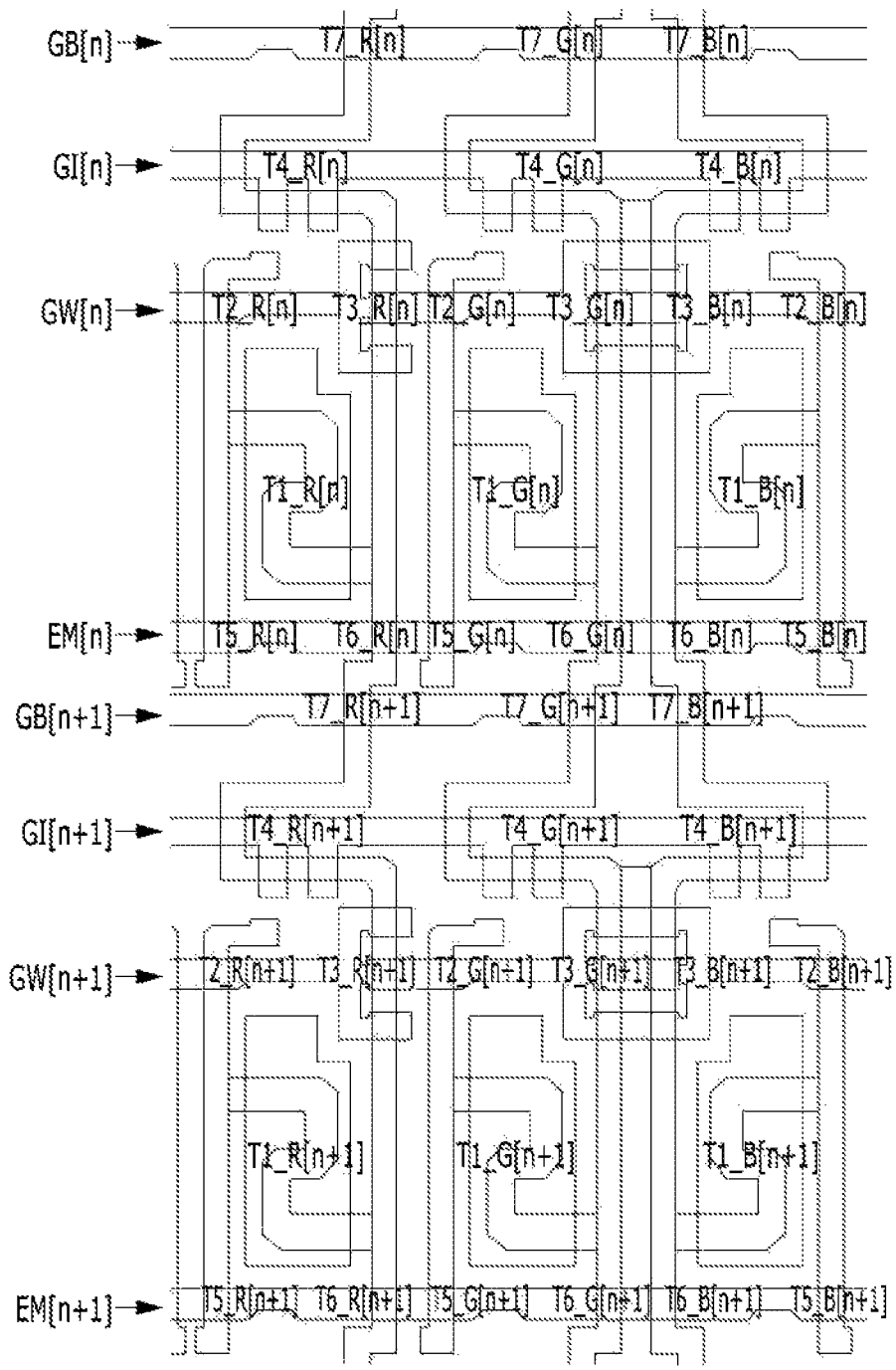
FIG. 5 is a diagram illustrating an arrangement of a plurality of transistors included in a plurality of pixels according to an exemplary embodiment.
Figure 6:
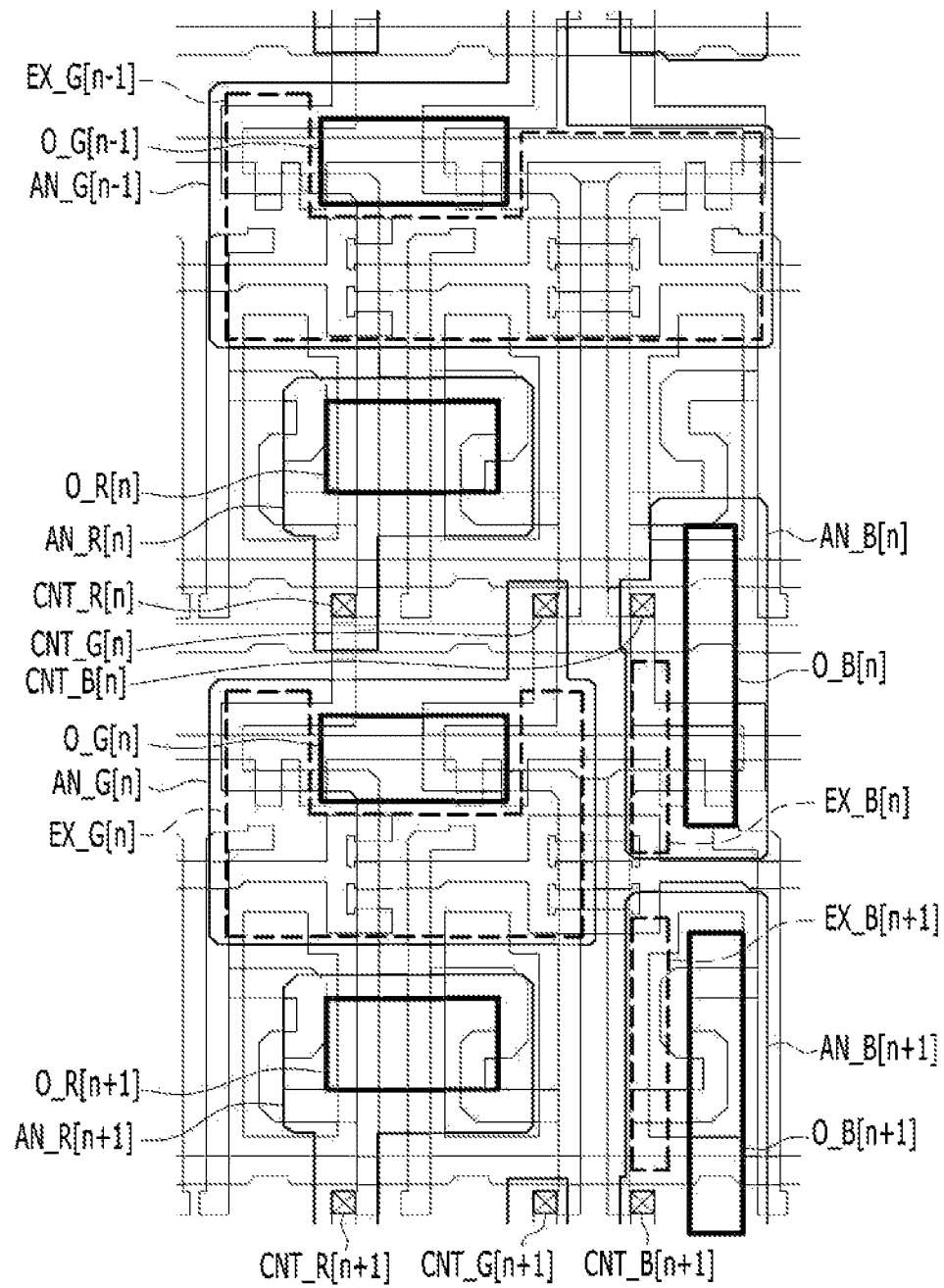
FIG. 6 is a drawing illustrating a structure and an arrangement of an anode electrode according to a first exemplary embodiment.

FIG. 5 is a diagram illustrating an arrangement of a plurality of transistors included in a plurality of pixels according to an exemplary embodiment.

In FIG. 5, six pixels of which one is described in FIG. 3 are formed. A red pixel R[n] of an n row is formed on a left upper end, a green pixel G[n] of an n row is formed on a center upper end, and a blue pixel B[n] of an n row is formed on a right upper end. Similarly, a red pixel R[n+1] of an n+1 row is formed on a left lower end, a green pixel G[n+1] of an n+1 row is formed on a center lower end, and a blue pixel B[n+1] of an n+1 row is formed on a right lower end.

In this case, the red pixel R[n] means a unit pixel area including transistors T1_R[n], T2_R[n], T3_R[n], T4_R[n], T5_R[n], T6_R[n], and T7_R[n]. The green pixel G[n] means a unit pixel area including transistors T1_G[n], T2_G[n], T3_G[n], T4_G[n], T5_G[n], T6_G[n], and T7_G[n]. The blue pixel B[n] means a unit pixel area including transistors T1_B[n], T2_B[n], T3_B[n], T4_B[n], T5_B[n], T6_B[n], and T7_B[n]. Each unit pixel area can also be equally applied to the n+1 row.

Color of each pixel is illustrative, and is not absolute. A mono color display can also be configured so that all pixels include only one color.

The six pixels shown in FIG. 5 is a minimal unit for illustrating a shape and an arrangement of the anode according to each exemplary embodiment to be described below in FIGS. 6 and 7. In FIG. 5, only a semiconductor layer and scan wiring layers 151, 152, 153, and 158, which are minimal configurations for showing a position of the transistor of each pixel, are shown, and other electrode layers are omitted for a clear illustration.

Electrode layouts of the red pixel R[n] and the green pixel G[n] are the same as each other, but an electrode layout of the blue pixel B[n] is configured to be bilaterally symmetrical with the electrode layout of the green pixel G[n]. According to another exemplary embodiment, the blue pixel B[n] can be configured in the same electrode layout as that of the red pixel R[n] and the green pixel G[n].

The red pixel R[n] includes the seven transistors T1_R[n], T2_R[n], T3_R[n], T4_R[n], T5_R[n], T6_R[n], and T7_R[n], the green pixel G[n] includes the seven transistors T1_G[n], T2_G[n], T3_G[n], T4_G[n], T5_G[n], T6_G[n], and T7_G[n], and the blue pixel B[n] includes the seven transistors T1_B[n], T2_B[n], T3_B[n], T4_B[n], T5_B[n], T6_B[n], and T7_B[n].

The red pixel R[n], the green pixel G[n], and the blue pixel B[n] share a bypass signal GB[n], a scan signal GI[n], a scan signal GW[n], and a light emission control signal EM[n] which are applied to the n row, in the same signal line.

Since a similar configuration is applied to the red pixel R[n+1], the green pixel G[n+1], and the blue pixel b[n+1] of the n+1 row, a description thereof will be omitted.

FIG. 6 is a drawing illustrating a structure and an arrangement of an anode electrode according to a first exemplary embodiment.

Referring to FIG. 6, as compared to FIG. 5, anodes AN_R[n], AN_G[n−1], AN_B[n], AN_R[n+1], AN_G[n], and AN_B[n+1], organic light emitting layers O_R[n], O_G[n−1], O_B[n], O_R[n+1], O_G[n], and O_B[n+1] are additionally shown.

The anode AN_R[n] is included in the red pixel R[n] of the n row, and is formed in an area overlapping an area in which the organic light emitting layer O_R[n] is formed. The anode AN_R[n] is formed to be extended so as to include a contact part CNT_R[n]. The contact part CNT_R[n] is connected to a drain electrode of the light emission control transistor TR6_R[n] of the red pixel R[n]. According to the present exemplary embodiment, the anode AN_R[n] does not include a first electrode extension part.

In the present exemplary embodiment, the first electrode extension part means a portion of which an anode electrode is formed to be extended for blocking light. As described above, in order to prevent an occurrence of a light leakage current of a target transistor which is on a current leakage path of the storage capacitor Cst, there is a need to block the target transistor from light.

The target transistor means a transistor having one end connected to a current path of the storage capacitor Cst.

Referring to again FIG. 1, a drain electrode D4 of the initialization transistor T4 and a drain electrode D3 of the compensation transistor T3 are connected to one end Cstl of the storage capacitor Cst. Therefore, since the initialization transistor T4 and the compensation transistor T3 provide the current path through which the charges of the storage capacitor Cst can exit, the initialization transistor T4 and the compensation transistor T3 correspond to the target transistor. According to the exemplary embodiment of FIGS. 6 and 7, the target transistor is the initialization transistors T4_R[n], T4_G[n], T4_B[n], T4_R[n+1], T4_G[n+1], and T4_B[n+1], and the compensation transistors T3_R[n], T3_G[n], T3_B[n], T3_R[n+1], T3_G[n+1], and T3_B[n+1].

The same principle can be applied to a pixel circuit different from the present exemplary embodiment. That is, in the case in which the transistor forming the current path is present on one end of the storage capacitor Cst, it can be determined that the corresponding transistor is the target transistor of the described technology.

Since the size of the anode may not be indefinitely increased in order to block all transistors from light with the anode, the described technology distinguishes the target transistor to be blocked from light with the anode from other transistors. That is, when the size of the anode is unconditionally extended, the anode of the organic light emitting element forms a plurality of other electrodes and parasitic capacitance. Therefore, in some embodiments, a voltage can change through parasitic capacitance according to voltage variation of other electrodes and the desired gray scale may not be represented. In addition, the driving transistor T1 is formed to be larger than other transistors in order to increase a driving range, and as a result, the gate electrode G1 of the driving transistor T1 is also formed to be large. Therefore, the anode and the gate electrode G1 of the driving transistor T1 form large parasitic capacitance, and a control of a driving current amount, which is a role of the driving transistor T1, may not be appropriately performed. Further, as the OLED display becomes high in resolution, the anode is positioned to overlap other pixel areas across the corresponding pixel area, and error caused by parasitic capacitance is randomized.

Therefore, according to the described technology, the anode having a minimum size for a maximum aperture ratio is maintained, and the first electrode extension part blocking the target transistor from light is further included, in addition to an area overlapping the area in which the organic light emitting layer, which is essentially included in the anode, is formed and the contact part applied with an electrical signal.

As described above, since it is preferable to minimize the size of the anode, the size of the first electrode extension part can also be configured depending on a degree of blocking the target transistor from light. The size and configuration of the first electrode extension part are different depending on the first exemplary embodiment of FIG. 6 and a second exemplary embodiment of FIG. 7.

The size of the anode is not unconditionally minimized. In order to achieve the maximum aperture ratio of the OLED display, the size of the anode can be minimized within a range including the area in which the organic light emitting layer is formed. That is, the size of the area of the formed organic light emitting layer can be a criterion of the minimization of the size of the anode.

The size of the area in which the organic light emitting layer is formed can be determined by resolution of the OLED display and a limitation of a configuration of a fine metal mask (FMM), which is a depositing mask used to deposit the organic light emitting layer.

An anode AN_G[n−1] is included in a green pixel (not shown) of an n−1 row, and is formed in an area overlapped with an area in which an organic light emitting layer O_R[n−1l] is formed. As described above, as resolution of the OLED display is increased, the anode AN_G[n−1] of the n−1 row is formed so as to be overlapped with the n row.

The anode AN_G[n−1] is formed to be extended so as to include a contact part (not shown). The contact part is connected to a drain electrode of a light emission control transistor (not shown) of the green pixel of the n−1 row.

The anode AN_G[n−1] includes a first electrode extension part EX_G[n−1]. The first electrode extension part EX_G[n−1] is configured to overlap an area in which the initialization transistors T4_R[n], T4_G[n], and T4_B[n], and the compensation transistors T3_R[n], T3_G[n], and T3_B[n] are formed. Therefore, the first electrode extension part EX_G[n−1] can block the initialization transistors T4_R[n], T4_G[n], and T4_B[n], and the compensation transistors T3_R[n], T3_G[n], and T3_B[n], which are the target transistors, from external light and leakage light of other pixels.

The anode AN_B[n] is included in the blue pixel B[n] of the n row, and is formed in an area overlapping an area in which the organic light emitting layer O_B[n] is formed. The anode AN_B[n] is formed to be extended so as to include a contact part CNT_B[n]. The contact part CNT_B[n] is connected to a drain electrode of the light emission control transistor TR6_B[n] of the blue pixel B[n].

The anode AN_B[n] includes a first electrode extension part EX_B[n]. The first electrode extension part EX_B[n] is configured to overlap a part of the compensation transistor T3_B[n+1]. The first electrode extension part EX_B[n] maintains a minimum distance from other anodes AN_B[n+1] and AN_G[n] in order to prevent interference with other anodes AN_B[n+1] and AN_G[n]. Therefore, the first electrode extension part EX_B[n] can partially block the compensation transistor T3_B[n+1], which is the target transistor, from external light and leakage light of other pixels.

In addition, the anode AN_B[n] blocks the initialization transistor T4_B[n+1], which is the target transistor from external light and leakage light of other pixel by an area overlapping the organic light emitting layer O_B[n].

The anode AN_R[n+1] is included in the red pixel R[n+1] of the n+1 row, and is formed in an area overlapping an area in which the organic light emitting layer O_R[n+1] is formed. The anode AN_R[n+1] is formed to be extended so as to include a contact part CNT_R[n+1]. The contact part CNT_R[n+1] is connected to a drain electrode of the light emission control transistor TR6_R[n+1] of the red pixel R[n+1]. According to the present exemplary embodiment, the anode AN_R[n+1] does not include a first electrode extension part.

The anode AN_G[n] is included in the green pixel G[n] of the n row, and is formed in an area overlapping an area in which the organic light emitting layer O_G[n] is formed. As described above, as resolution of the OLED display is increased, the anode of the n row is formed so as to overlap the n+1 row.

The anode AN_G[n] is formed to be extended so as to include a contact part CNT_G[n]. The contact part CNT_G[n] is connected to a drain electrode of the light emission control transistor TR6_G[n] of the green pixel G[n] of the n row.

The anode AN_G[n] includes a first electrode extension part EX_G[n]. The first electrode extension part EX_G[n] is configured to overlap an area in which the initialization transistors T4_R[n+1] and T4_G[n+1], and the compensation transistors T3_R[n+1] and T3_G[n+1] are formed. Therefore, the first electrode extension part EX_G[n] can block the initialization transistors T4_R[n+1] and T4_G[n+1], and the compensation transistors T3_R[n+1] and T3_G[n+1], which are the target transistors, from external light and leakage light of other pixels.

The anode AN_B[n+1] is included in the blue pixel B[n+1] of the n+1 row, and is formed in an area overlapping an area in which the organic light emitting layer O_B[n+1] is formed. The anode AN_B[n+1] is formed to be extended so as to include a contact part CNT_B[n+1]. The contact part CNT_B[n+1] is connected to a drain electrode of the light emission control transistor TR6_B[n+1] of the blue pixel B[n+1].

The anode AN_B[n+1] includes a first electrode extension part EX_B[n+1]. The first electrode extension part EX_B[n+1] is configured to overlap a part of the compensation transistor T3_B[n+1]. The first electrode extension part EX_B[n+1] maintains a minimum distance from other anodes AN_B[n] and AN_G[n] in order to prevent interference with other anodes AN_B[n] and AN_G[n]. Therefore, the first electrode extension part EX_B[n+1] can partially block the compensation transistor T3_B[n+1], which is the target transistor, from external light and leakage light of other pixels.

As a result, according to the first exemplary embodiment of FIG. 6, by the anodes AN_R[n], AN_G[n−1], AN_B[n], AN_R[n+1], AN_G[n], and AN_B[n+1], the initialization transistors T4_R[n], T4_G[n], T4_B[n], T4_R[n+1], T4_G[n+1], and T4_B[n+1], and the compensation transistors T3_R[n], T3_G[n], T3_B[n], T3_R[n+1], and T3_G[n+1], which are the target transistors, are completely blocked from light, and the compensation transistor T3_B[n+1] is partially blocked from light.

In the case in which the first electrode extension part is applied to other pixel circuits, the compensation transistor T3_B[n+1], which is the target transistor, can be completely blocked from light. As described above, the transistor, which is a target of light blocking, does not come from names of the initialization transistors and the compensation transistors, but is defined by a relationship with the storage capacitor.

In a case of an anode design according to the first exemplary embodiment of FIG. 6, a flicker phenomenon can be minimized by a maximum light blocking effect. In addition, the present exemplary embodiment can be more effectively applied to a mono color display device in which a color deviation does not matter.

In addition, referring to again FIG. 4, during a process of manufacturing a general OLED display, a problem in which residues float due to bad adhesive characteristics between the first organic insulating layer 180 and the second organic insulating layer 181 can occur. However, according to the first exemplary embodiment of FIG. 6, since the anode having a wide area is interposed between the first organic insulating layer 180 and the second organic insulating layer 181, adhesive characteristics are improved, thereby making it possible to reduce the above-mentioned problem.

The configuration of the six pixels shown in FIG. 6, which is one set, can be repeatedly applied to a plurality of pixels included in the OLED display to thereby configure a layout.

Figure 7:
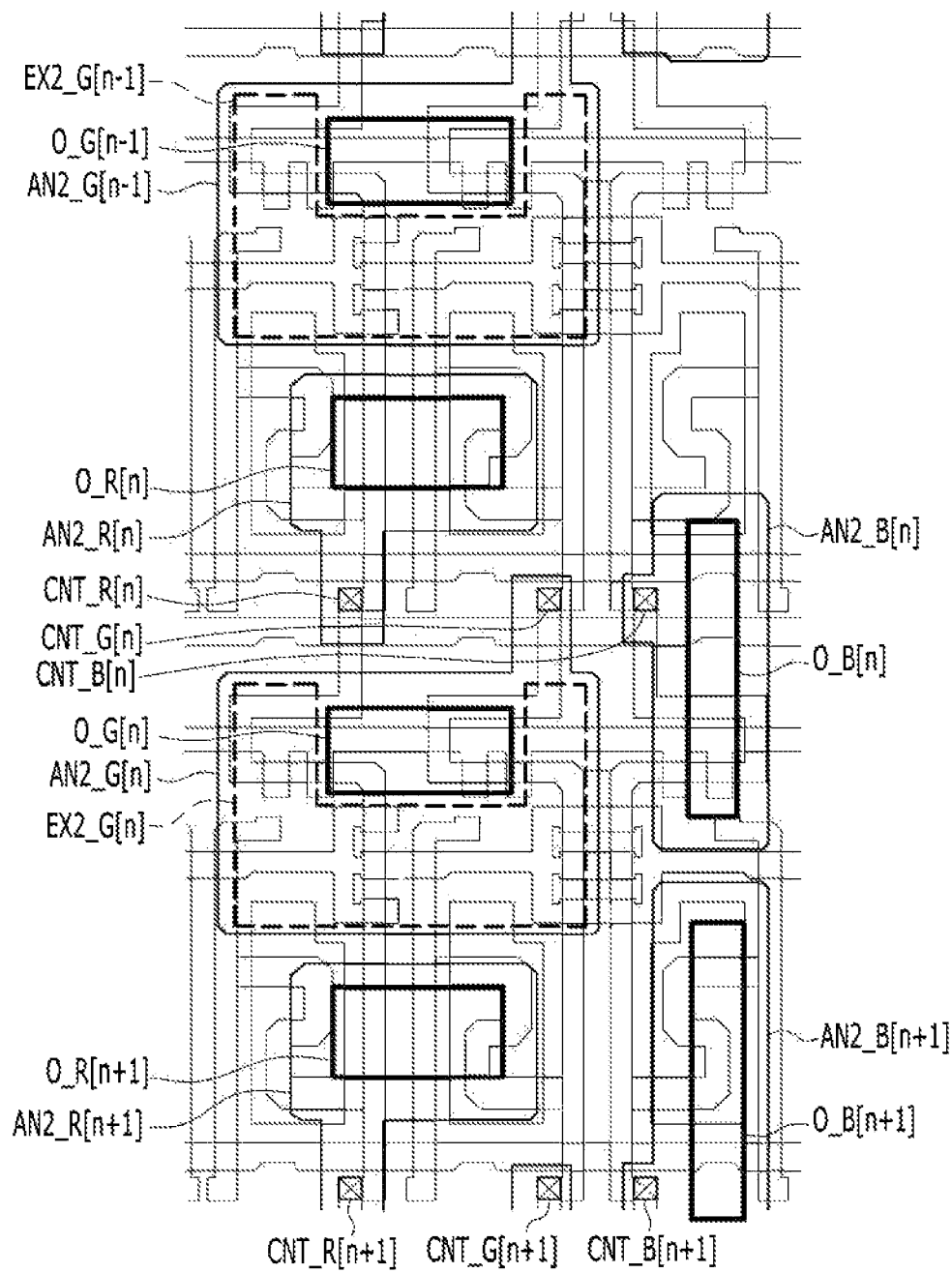
FIG. 7 is a drawing illustrating a structure and an arrangement of an anode electrode according to a second exemplary embodiment.

FIG. 7 is a drawing illustrating a structure and an arrangement of an anode electrode according to a second exemplary embodiment.

Referring to FIG. 7, as compared to FIG. 6, forms of the anodes AN2_R[n], AN2_G[n−1], AN2_B[n], AN2_R[n+1], AN2_G[n], and AN2_B[n+1] are changed.

The anode AN2_R[n] is included in the red pixel R[n] of the n row, and is formed in an area overlapping an area in which the organic light emitting layer O_R[n] is formed. The anode AN2_R[n] is formed to be extended so as to include a contact part CNT_R[n]. The contact part CNT_R[n] is connected to a drain electrode of the light emission control transistor TR6_R[n] of the red pixel R[n]. According to the present exemplary embodiment, the anode AN2_R[n] does not include a first electrode extension part.

An anode AN2_G[n−1] is included in a green pixel (not shown) of an n−1 row, and is formed in an area overlapping an area in which an organic light emitting layer O_G[n−1] is formed. As described above, as resolution of the OLED display is increased, the anode of the n−1 row is formed so as to be overlapped with the n row.

The anode AN2_G[n−1] extends so as to include a contact part (not shown). The contact part is connected to a drain electrode of a light emission control transistor (not shown) of the green pixel of the n−1 row.

The anode AN2_G[n−1] includes a first electrode extension part EX2_G[n−1]. The first electrode extension part EX2_G[n−1] is configured to overlap an area in which the initialization transistors T4_R[n] and T4_G[n], and the compensation transistors T3_R[n] and T3_G[n] are formed. Therefore, the first electrode extension part EX2_G[n−1] can block the initialization transistors T4_R[n] and T4_G[n], and the compensation transistors T3_R[n] and T3_G[n], which are the target transistors, from external light and leakage light of other pixels.

The anode AN2_B[n] is included in the blue pixel B[n] of the n row, and is formed in an area overlapping an area in which the organic light emitting layer O_B[n] is formed. The anode AN2_B[n] extends so as to include a contact part CNT_B[n]. The contact part CNT_B[n] is connected to a drain electrode of the light emission control transistor TR6_B[n] of the blue pixel B[n]. According to the present exemplary embodiment, the anode AN2_B[n] does not include a first electrode extension part.

The anode AN_B[n] blocks the initialization transistor T4_B[n+1], which is the target transistor from external light and leakage light of other pixel by an area overlapping the organic light emitting layer O_B[n].

The anode AN2_R[n+1] is included in the red pixel R[n+1] of the n+1 row, and is formed in an area overlapped with an area in which the organic light emitting layer O_R[n+1] is formed. The anode AN2_R[n+1] is formed to be extended so as to include a contact part CNT_R[n+1]. The contact part CNT R[n+1] is connected to a drain electrode of the light emission control transistor TR6_R[n+1] of the red pixel R[n+1]. According to the present exemplary embodiment, the anode AN2_R[n+1] does not include a first electrode extension part.

The anode AN2_G[n] is included in the green pixel G[n] of the n row, and is formed in an area overlapping an area in which the organic light emitting layer O_G[n] is formed. As described above, as resolution of the OLED display is increased, the anode of the n row is formed so as to be overlapping the n+1 row.

The anode AN2_G[n] extends so as to include a contact part CNT_G[n]. The contact part CNT_G[n] is connected to a drain electrode of the light emission control transistor TR6_G[n] of the green pixel G[n] of the n row.

The anode AN2_G[n] includes a first electrode extension part EX2_G[n]. The first electrode extension part EX2_G[n]

is configured to be overlapped with an area in which the initialization transistors T4_R[n+1] and T4_G[n+1], and the compensation transistors T3_R[n+1] and T3_G[n+1] are formed. Therefore, the first electrode extension part EX2_G [n] can block the initialization transistors T4_R[n+1] and T4_G[n+1], and the compensation transistors T3_R[n+1] and T3_G[n+1], which are the target transistors, from external light and leakage light of other pixels.

The anode AN2_B[n+1] is included in the blue pixel B[n+1] of the n+1 row, and is formed in an area overlapping an area in which the organic light emitting layer O_B[n+1] is formed. The anode AN2_B[n+1] extends so as to include a contact part CNT_B[n+1]. The contact part CNT_B[n+1] is connected to a drain electrode of the light emission control transistor TR6_B[n+1] of the blue pixel B[n+1]. According to the present exemplary embodiment, the anode AN2_B [n+1] does not include a first electrode extension part.

As a result, according to the second exemplary embodiment of FIG. 7, by the anodes AN2_R[n], AN2_G[n−1], AN2_B[n], AN2_R[n+1], AN2_G[n], and AN2_B[n+1], the initialization transistors T4_R[n], T4_G[n], T4_R[n+1], T4_G[n+1], and T4_B[n+1], and the compensation transistors T3_R[n], T3_G[n], T3_R[n+1], and T3_G[n+1], which are the target transistors, are completely blocked from light, and the initialization transistor T4_B[n] and the compensation transistors T3_B[n] and T3_B[n+1] are not blocked from light.

Although the target transistors included in the blue pixels B[n] and B[n+1] are configured so as not to be blocked from light, since a contribution portion for overall luminance of the blue pixel is low, a flicker which can be viewed is minimized.

The OLED display can include a low power consumption mode driven at a lower frequency, and a time in which the storage capacitor holds a recoded voltage in the low power consumption mode can be longer than a time in which the storage capacitor holds the recorded voltage upon a normal driving. The lower frequency can be a predetermined frequency less than a predetermined frequency.

As a result of measuring luminance of the OLED display configured in the layout of FIG. 7, an overall luminance value of the OLED display is about 681.82 cd/m$^2$). In this case, a luminance value of the red pixel is about 185.59(cd/m$^2$), which is about 27% of the overall luminance. A luminance value of the green pixel is about 444.23 (cd/m$^2$), which is about 65% of the overall luminance. A luminance value of the blue pixel is about 51.99 (cd/m$^2$), which is about 8% of the overall luminance.

That is, even though the flicker phenomenon partially occurs in the blue pixel, the user can not view the flicker phenomenon.

In the case of an anode design according to the second exemplary embodiment of FIG. 7, the anodes included in the same color pixel have the same shape and size. That is, the anodes included in all red pixels have a first shape and size, the anodes included in all green pixels have a second shape and size, and the anodes included in all blue pixels have a third shape and size. There are favorable characteristics that the same capacitance is implemented for the same color pixel and there is no room to cause a color deviation problem.

The drawings and the detailed description of the described technology which are described above are merely illustrative, are just used for the purpose of describing the inventive technology, and are not used for qualifying the meaning or limiting the scope of the present invention, which is disclosed in the appended claims. Therefore, it will be appreciated to those skilled in the art that various modifications and are made and other equivalent embodiments are available. Accordingly, the actual technical protection scope of the present invention should be determined by the spirit of the appended claims.

What is claimed is:

1. An organic light-emitting diode (OLED) display, comprising:
    a plurality of pixels, wherein each of the pixels corresponds to one among a first color pixel, a second color pixel, and a third color pixel,
    wherein each of the pixels includes:
        a storage capacitor configured to store a data voltage;
        an initialization transistor having a first end electrically connected to a first end of the storage capacitor and a second end electrically connected to an initialization voltage line;
        a driving transistor configured to adjust an amount of current flowing in an OLED;
        a compensation transistor having a first end electrically connected to a gate electrode of the driving transistor and the first end of the storage capacitor, and a second end electrically connected to a first end of the driving transistor;
        an organic light emitting layer; and
        the OLED including a first electrode formed over the organic light emitting layer,
    wherein the first electrode of the OLED of the second color pixel in a first row completely blocks the initialization and the compensation transistors included in each of the first and second color pixels in a second row from light,
    wherein the first electrode of the OLED of the third color pixel in the first row partially blocks the compensation transistor included in the third color pixel in a second row from the light.

2. The OLED display of claim 1, wherein the first, second and third colors respectively include red, green, and blue.

3. The OLED display of claim 1, wherein at least one of the initialization transistor and the compensation transistor includes a plurality of gate electrodes.

4. The OLED display of claim 1, wherein a first organic light emitting layer of one of the pixels is adjacent to a second organic emitting layer, and wherein the first and second organic light emitting layers have a minimum interval therebetween formed by a depositing mask.

5. The OLED display of claim 4, wherein the first electrode of the OLED of the third color pixel in the first row is formed over the organic light emitting layer and includes a contact configured to be applied with an electrical signal.

6. The OLED display of claim 1, wherein the OLED display is configured to be driven in a low power consumption mode at a first frequency below a predetermined frequency, and wherein a time in which the storage capacitor holds a recorded voltage in the low power consumption mode is greater than a time in which the storage capacitor holds the recorded voltage upon a normal driving.

7. The OLED display of claim 1, wherein the first electrode of the third color pixel in the first row that partially blocks the compensation transistor of the third color pixel in the second row from the light completely blocks the initialization transistor of the third color pixel in the first row from the light.

8. An organic light-emitting diode (OLED) display, comprising:

a storage capacitor having a first end electrically connected to a power source and configured to store a data voltage;

an initialization transistor having a first end electrically connected to a first end of the storage capacitor and a second end electrically connected to an initialization voltage line;

a driving transistor configured to adjust an amount of current flowing in an OLED of a pixel of a first color in a first row;

a compensation transistor having a first end electrically connected to a gate electrode of the driving transistor and the first end of the storage capacitor, and a second end electrically connected to a first end of the driving transistor; and the OLED configured to receive the data voltage from the storage capacitor and including a first electrode, and wherein the first electrode of the OLED of the pixel of the first color in the first row partially blocks a compensation transistor of a pixel of the first color in a second row from light.

9. The OLED display of claim 8, wherein a first electrode of an OLED of a pixel of a second color of the first row completely overlaps an initialization transistor or a compensation transistor of a pixel of the second color in the second row, and wherein the first electrode of the OLED of the pixel of the second color of the first row completely overlaps an initialization transistor or a compensation transistor of a pixel of a third color in the second row of the OLED display.

10. The OLED display of claim 8, wherein each compensation transistor includes first to third compensation transistors overlapping a same layer in a plan view.

11. The OLED display of claim 10, wherein each initialization transistor includes first to third initialization transistors overlapping a same layer in the plan view.

12. The OLED display of claim 8, wherein the OLED further includes an organic light emitting layer overlapping the first electrode in a plan view of the OLED display.

13. The OLED display of claim 12, wherein the first electrode overlapping the organic light emitting layer has four sides, and wherein the same layer of the first electrode is adjacent to three of the four sides of the first electrode overlapping the organic light emitting layer.

14. The OLED display of claim 8, wherein the light includes external light or leakage light from a plurality of pixels other than the pixel including the OLED.

* * * * *